(12) United States Patent
Zheng et al.

(10) Patent No.: US 9,184,206 B1
(45) Date of Patent: Nov. 10, 2015

(54) BACKSIDE ILLUMINATED COLOR IMAGE SENSORS AND METHODS FOR MANUFACTURING THE SAME

(71) Applicant: OmniVision Technologies, Inc., Santa Clara, CA (US)

(72) Inventors: Wei Zheng, Los Gatos, CA (US); Dyson Hsin-Chih Tai, San Jose, CA (US); Vincent Venezia, Los Gatos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/270,309

(22) Filed: May 5, 2014

(51) Int. Cl.
*H01L 21/00* (2006.01)
*H01L 27/146* (2006.01)
*H01L 21/762* (2006.01)
*H01L 21/768* (2006.01)

(52) U.S. Cl.
CPC .... *H01L 27/14687* (2013.01); *H01L 21/76224* (2013.01); *H01L 21/76829* (2013.01); *H01L 27/1464* (2013.01); *H01L 27/14645* (2013.01)

(58) Field of Classification Search
CPC ............... H01L 27/14636; H01L 27/14687; H01L 21/76898; H01L 23/48
USPC ............................................. 257/447; 438/73
See application file for complete search history.

(56) References Cited

U.S. PATENT DOCUMENTS

| 7,749,799 B2 | 7/2010 | Pain |
| 2009/0124037 A1 | 5/2009 | Yu |
| 2014/0015083 A1 | 1/2014 | Kao |
| 2014/0038337 A1* | 2/2014 | Pyo ................................ 438/65 |

* cited by examiner

*Primary Examiner* — Tu-Tu Ho
(74) *Attorney, Agent, or Firm* — Lathrop & Gage LLP

(57) ABSTRACT

A method for manufacturing a backside illuminated color image sensor includes (a) modifying the frontside of an image sensor wafer, having pixel arrays, to produce electrical connections to the pixel arrays, wherein the electrical connections extend depth-wise into the image sensor wafer from the frontside, and (b) modifying the backside of the image sensor wafer to expose the electrical connections.

17 Claims, 14 Drawing Sheets

US 9,184,206 B1

BACKSIDE ILLUMINATED COLOR IMAGE SENSORS AND METHODS FOR MANUFACTURING THE SAME

BACKGROUND

The demand for advances in digital camera performance is ever increasing. Consumers wish to capture photos and videos with high resolution and high sensitivity. Improved spatial resolution may be achieved by reducing the area of individual image sensor pixels, such that a greater number of pixels may be accommodated by the same image sensor area. However, a reduction in pixel size generally reduces the light collected by each pixel and thus leads to a decrease in light sensitivity. Decreased light sensitivity adversely affects camera performance in low-light situations, for example nighttime photography, and in capture of dynamic scenes with fast moving objects, such as scenes of sporting events. One solution to this problem, which is implemented in commonly available digital single-lens reflex camera, is to provide an image sensor with a significantly larger area. This allows for incorporating a larger number of pixels without reducing the area of individual pixels. Unfortunately, such sensors are associated with greater cost, both for the image sensor itself and for the imaging objective required for properly imaging a scene onto the enlarged sensor, which precludes use in many applications.

Backside illuminated image sensors offer an alternative solution. In conventional frontside illuminated image sensors light incident on a pixel must pass through a layer of electrical connections before reaching the photosensitive element. This is associated with a loss of light. Backside illuminated image sensors are oriented, seen from the point of view of incident light, such that the layer of electrical connections is located below the photosensitive element. Accordingly, incident light may reach the photosensitive elements without being affected by the electrical connections, which results in greater light collection efficiency and, thus, improved sensitivity.

Color image capture is provided by disposing a color filter on top of the image sensor pixel array. Different pixels are associated with different color coatings, where each type of color coating transmits a certain color. For example, in a Bayer type color image sensor, the color filter includes three different types of color coatings, R, G, and B, configured for transmission of red, green, and blue light, respectively. Color pixels, providing color data, may be formed by grouping together one pixel with R-type coating, two pixels with G-type coating, and one pixel with B-type coating.

SUMMARY

In an embodiment, a method for manufacturing a backside illuminated color image sensor includes (a) modifying the frontside of an image sensor wafer, having pixel arrays, to produce electrical connections to the pixel arrays, wherein the electrical connections extend depth-wise into the image sensor wafer from the frontside, and (b) modifying the backside of the image sensor wafer to expose the electrical connections.

DETAILED DESCRIPTION OF THE EMBODIMENTS

Figure 1:
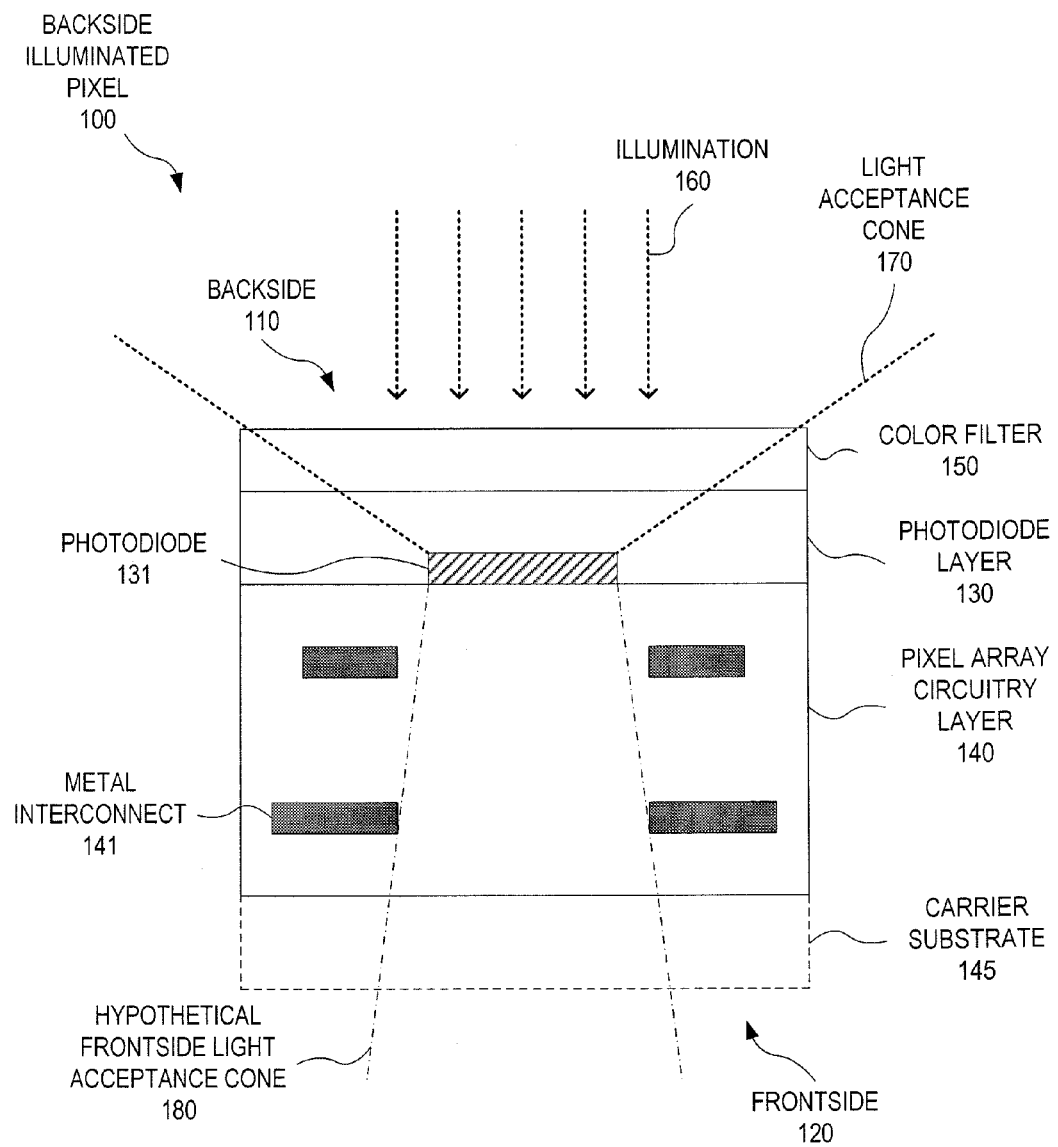
FIG. 1 illustrates a backside illuminated image sensor pixel, according to an embodiment.

FIG. 1 illustrates one exemplary backside illuminated (BSI) pixel 100 that represents an individual pixel in a BSI color image sensor. BSI pixel 100 has a backside 110 and a frontside 120. BSI pixel 100 includes a photodiode 131, located in a photodiode layer 130, metal interconnects 141 located in a pixel array circuitry layer 140, and a color filter 150. Photodiode layer 130, pixel array circuitry layer 140, and color filter 150 span the extent of an array of BSI pixels 100 in a BSI color image sensor. Metal interconnects 141 are a portion of the electrical circuitry required to read out electrical signals generated by the array of photodiodes 100. For clarity of illustration, not all metal interconnects 141 are labeled in FIG. 1. BSI pixel 100 may include fewer or more metal interconnects 141, and/or differently arranged metal interconnects 141, than illustrated in FIG. 1, without departing from the scope hereof. BSI pixel 100 includes a color filter 150 for selecting a desired spectral portion of illumination 160 incident on backside 110, for example red, green, or blue light. Optionally, BSI pixel 100 further includes an additional layer, not illustrated in FIG. 1, located between photodiode layer 130 and color filter 150, for modifying illumination 160. This optional layer may include opaque elements for preventing illumination 160 incident on one BSI pixel 100 from reaching a photodiode 131 of a neighboring BSI pixel 100, and/or include an anti-reflective coating. Pixel array circuitry layer 140 may be bonded to a carrier substrate 145.

Photodiode layer 130 is located between backside 110 and pixel array circuitry layer 140, such that illumination 160 incident on BSI pixel 100 may reach photodiode 131 without having to pass through pixel array circuitry layer 140. Accordingly, BSI pixel 100 has a light acceptance cone 170 which is unaffected by metal interconnects 141. A hypothetical frontside acceptance cone 180 illustrates the light acceptance cone for a corresponding frontside illuminated image sensor receiving illumination through frontside 120. Due to the presence of metal interconnects 141, hypothetical frontside acceptance 180 cone is significantly smaller than light acceptance cone 170. Thus, BSI pixel 100 is more photosensitive than the corresponding hypothetical frontside illuminated pixel.

One challenge associated with BSI color image sensors is gaining access to metal interconnects 141, as pixel array circuitry layer 140 is not readily accessible from backside 110. Typically, BSI image sensor manufacturing includes gaining access to pixel array circuitry layer 140 by etching deep trenches from backside 110 into pixel array circuitry layer 140. According to one conventional method, the deep trenches is etched prior to applying color filter 150. However, the deep trenches affect the process for applying color filter 150 and cause non-uniform thickness of color filter 150. This in turn leads to striations in color images captured using the sensor. According to another conventional method, color filter 150 is applied prior to etching the deep trenches and then masked while etching the deep trenches. Generally, the deep trenches must be etched into silicon, which imposes challenging requirements to the masking of color filter 150.

Disclosed herein are methods that overcome these challenges. In the presently disclosed methods, trenches with electrical connections to metal interconnects 141 are formed from frontside 120, prior to bonding pixel array circuitry layer 140 to carrier substrate 145. The trenches extend through pixel array circuitry layer 140 and into photodiode layer 130. In a subsequent step, backside 110 is modified, using less invasive processes than those associated with conventional methods, to gain access to the electrical connections of the trenches. The methods disclosed herein further allow for applying color filter 150 to a flat surface, as opposed to a surface with deep trenches.

Figure 2A:
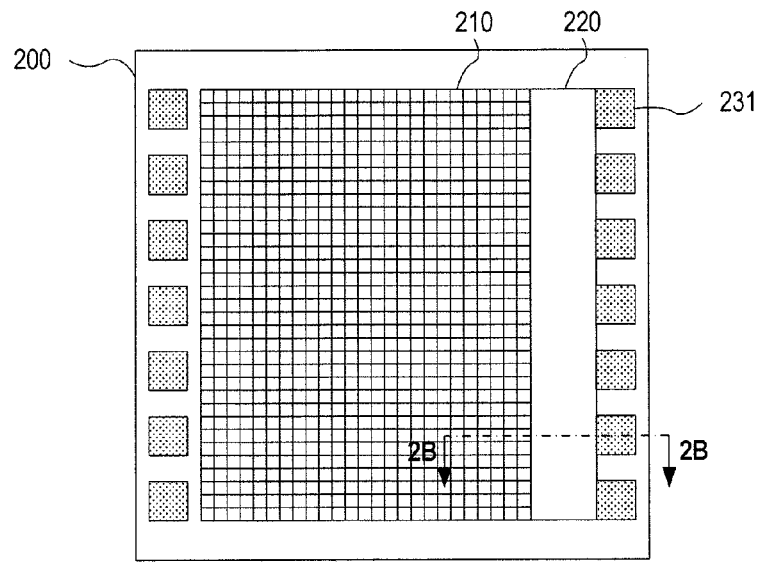
FIGS. 2A and 2B illustrate, in top plan view and cross-sectional side view, respectively, a backside illuminated color image sensor, according to an embodiment.
Figure 2B:
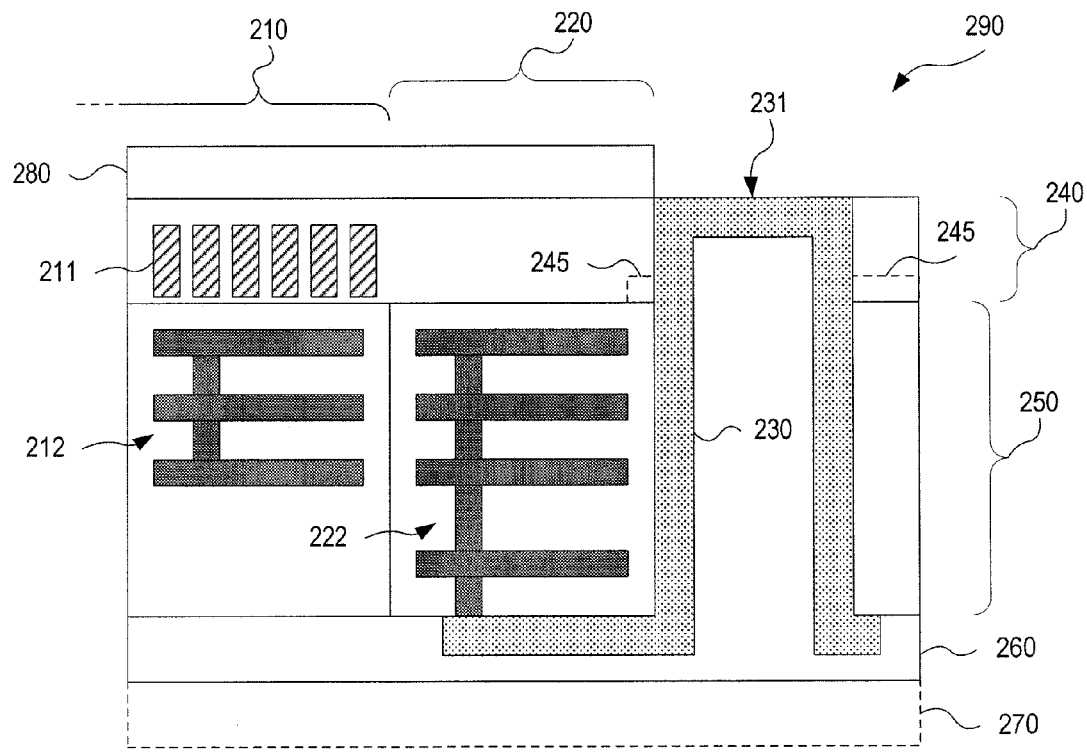

FIGS. 2A and 2B illustrate one exemplary BSI color image sensor 200. FIG. 2A shows BSI color image sensor 200 in top plan view. FIG. 2B shows a portion of BSI color image sensor 200 in cross-sectional side view, where the cross section is taken along line 2B-2B in FIG. 2A. FIGS. 2A and 2B are best viewed together. FIGS. 2A and 2B are not drawn to scale. BSI color image sensor 200 includes a pixel array 210 of BSI pixels such as BSI pixel 100 of FIG. 1, a peripheral area 220 located next to pixel array 210, and electrical connection pads 231. For clarity of illustration, not all electrical connection pads 231 are labeled in FIG. 2A. Electrical connection pads 231 provide electrical connections to the circuitry associated with pixel array 210. Electrical connection pads 231 may be used, for example, to readout signals generated by photodiodes, such as photodiode 131, of pixels of pixel array 210, and/or apply voltages to the photodiodes.

BSI color image sensor 200 may include fewer or more electrical connection pads 231 than illustrated in FIG. 2A, without departing from the scope hereof. Likewise, BSI color image sensor 200 may include more peripheral areas 220 than illustrated in FIG. 2A, without departing from the scope hereof. Additionally pixel array 210, peripheral area 220, and electrical connection pads 231 may be arranged differently from what is shown in FIG. 2A, without departing from the scope hereof.

As illustrated in FIG. 2B, BSI color image sensor 200 has a backside 290. BSI color image sensor 200 includes a photodiode layer 240, which includes a plurality of photodiodes 211, each photodiode 211 corresponding to a different pixel of pixel array 210. Photodiode layer 240 is disposed on a circuitry layer 250, which includes metal interconnect layers 212 located in pixel array 210 and metal interconnect layers 222 located in peripheral area 220. Metal interconnect layers 212 are an embodiment of metal interconnects 141 of FIG. 1. In an embodiment, metal interconnect layers 212 include three layers of metal interconnects, and metal interconnect layers 222 include four layers of metal interconnects. However, metal interconnect layers 212 and 222 may include other numbers of layers of metal interconnects, without departing from the scope hereof. At least a portion of metal interconnect layers 222 are communicatively coupled with metal interconnect layers 212. Photodiode layer 240 and circuitry layer 250 are embodiments of photodiode layer 130 and pixel array circuitry layer 140, respectively, of FIG. 1. In an embodiment, photodiode layer 240 is a silicon layer with embedded photodiodes 211. In an embodiment, circuitry layer 250 is a silicon oxide layer with embedded metal interconnect layers 212 and 222.

Each of at least a portion of electrical connection pads 231 are formed by manufacturing an electrical connection 230 from a front-facing surface of circuitry layer 250 to a location accessible from backside 290. Electrical connection 230 is formed during frontside processing of BSI color image sensor 200. Electrical connection 230 may be a layer of aluminum-copper alloy with thickness of, for example, between 0.5 micron and 1.5 micron. Electrical connection 230 contacts the front-most layer of metal interconnect layers 222. In an embodiment, the interface between photodiode layer 240 and circuitry layer 250 includes, in the region adjacent to electrical connection 230, a shallow layer of electrically insulating material 245 such as silicon oxide. Electrically insulating material 245 may be located in photodiode layer 240, as illustrated in FIG. 2B, in circuitry layer 250, or in a combination thereof, without departing from the scope hereof. Electrically insulating material 245 reduces the risk of electrical shortage between photodiode layer 240 and circuitry layer 250 in the region adjacent to electrical connection 230. In some embodiments, for clarity not illustrated in FIG. 2B, electrical connection 230 is electrically insulated from photodiode layer 240 and circuitry layer 250. Such electrical insulation may be provided, for example, by including an insulating liner at the interfaces of electrical connection 230 with photodiode layer 240 and circuitry layer 250.

An electrically insulating layer 260, such as silicon oxide, is disposed on circuitry layer 250 and electrical connection 230. An optical layer 280 is disposed on photodiode layer 240. Optical layer 280 includes a color filter, for providing color image capture capability. Optionally, optical layer 280 includes additional elements for modifying illumination incident on backside 290, such as opaque elements for preventing illumination incident on one pixel from reaching a photodiode of a neighboring pixel and/or an anti-reflective coating. Optical layer 280 may have extent different from what is shown in FIG. 2B and, for example, cover larger portions of photodiode layer 240, without departing from the scope hereof. In an embodiment, electrically insulating layer 260 is bonded to a carrier substrate 270. Carrier substrate 270 may serve to provide structural stability and robustness during manufacturing, and may be significantly thicker than what is indicated by FIG. 2B.

Figure 3:
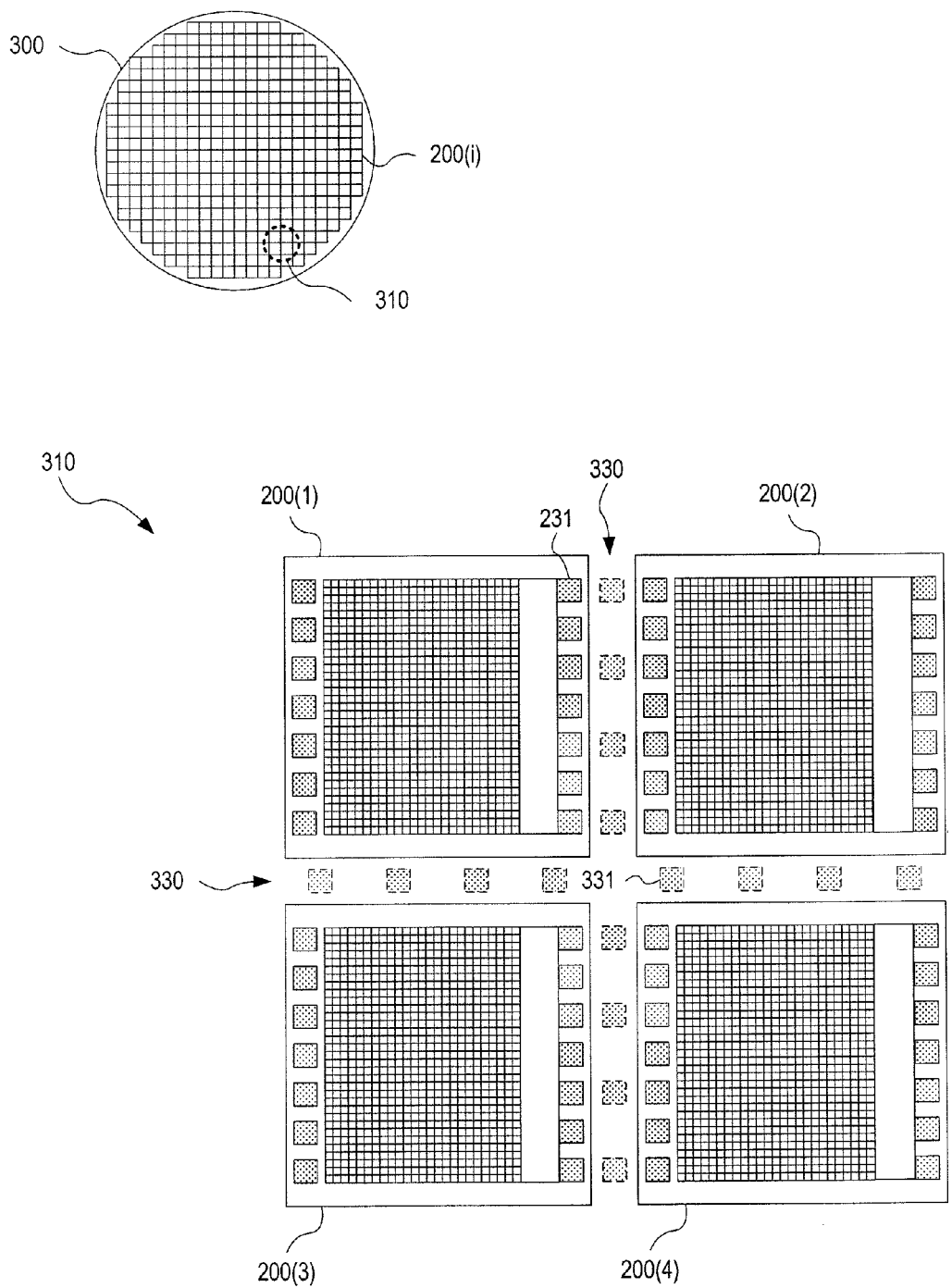
FIG. 3 illustrates an image sensor wafer including a plurality of backside illuminated color image sensors, according to an embodiment.

FIG. 3 illustrates one exemplary image sensor wafer 300 manufactured using methods disclosed herein. Image sensor wafer 300 includes a plurality of BSI color image sensors 200 (FIGS. 2A and 2B). A close-up 310 of image sensor wafer 300 shows a group of four BSI color image sensors 200. Between BSI color image sensors are streets 330. When singulating BSI color image sensors 200 from image sensor wafer 300, image sensor wafer 300 is cut along streets 300. Streets 300 may include electrical connection pads 331 for testing of BSI color image sensors 200 during manufacturing. Electrical connection pads 331 may be formed using the same methods as electrical connection pads 231, or other methods known in the art.

Figure 4:
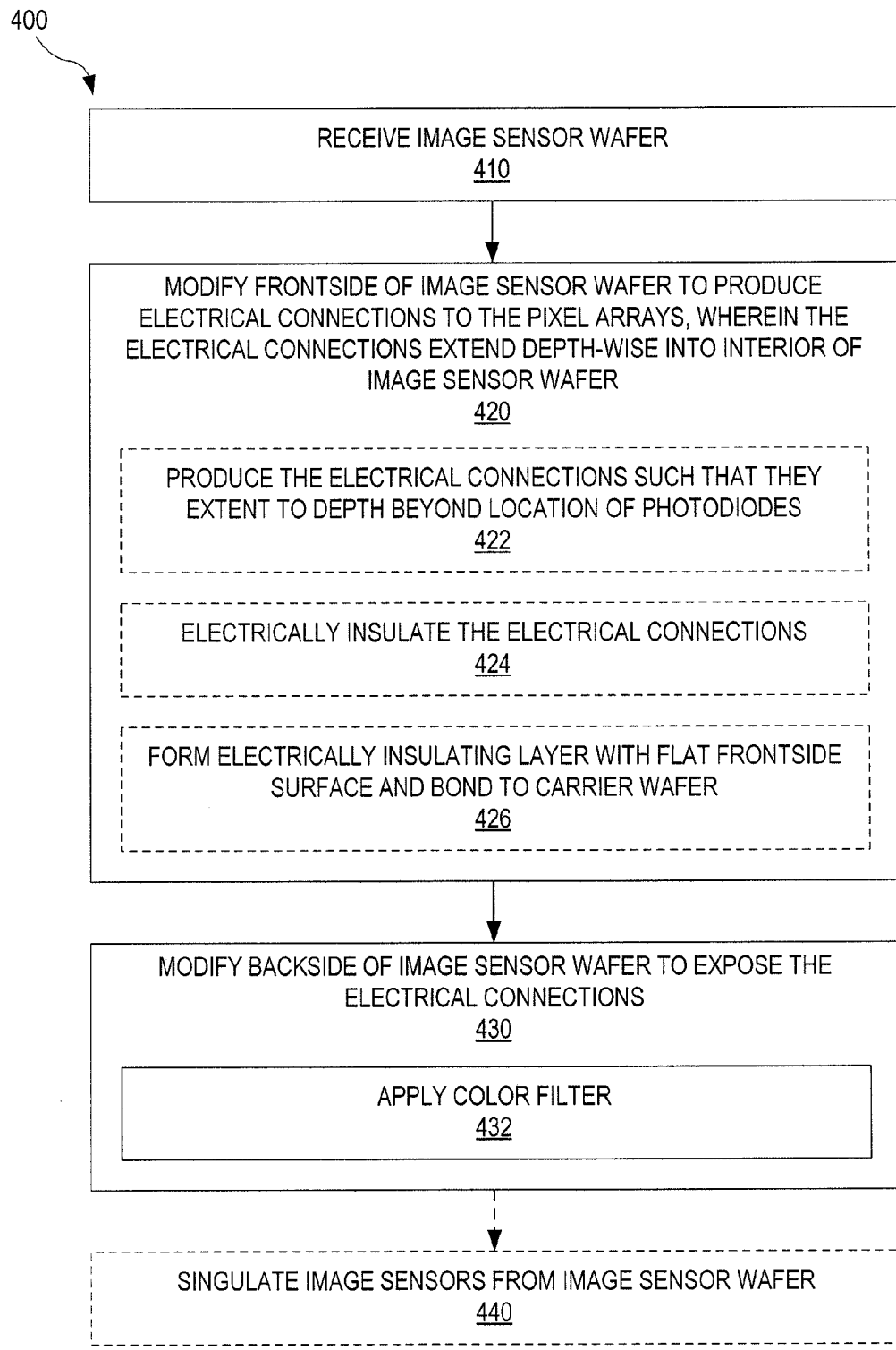
FIG. 4 illustrates a method for manufacturing an image sensor wafer including a plurality of backside illuminated color image sensors, wherein the method optionally includes manufacturing a plurality of backside illuminated color image sensors, according to an embodiment.
Figure 5:
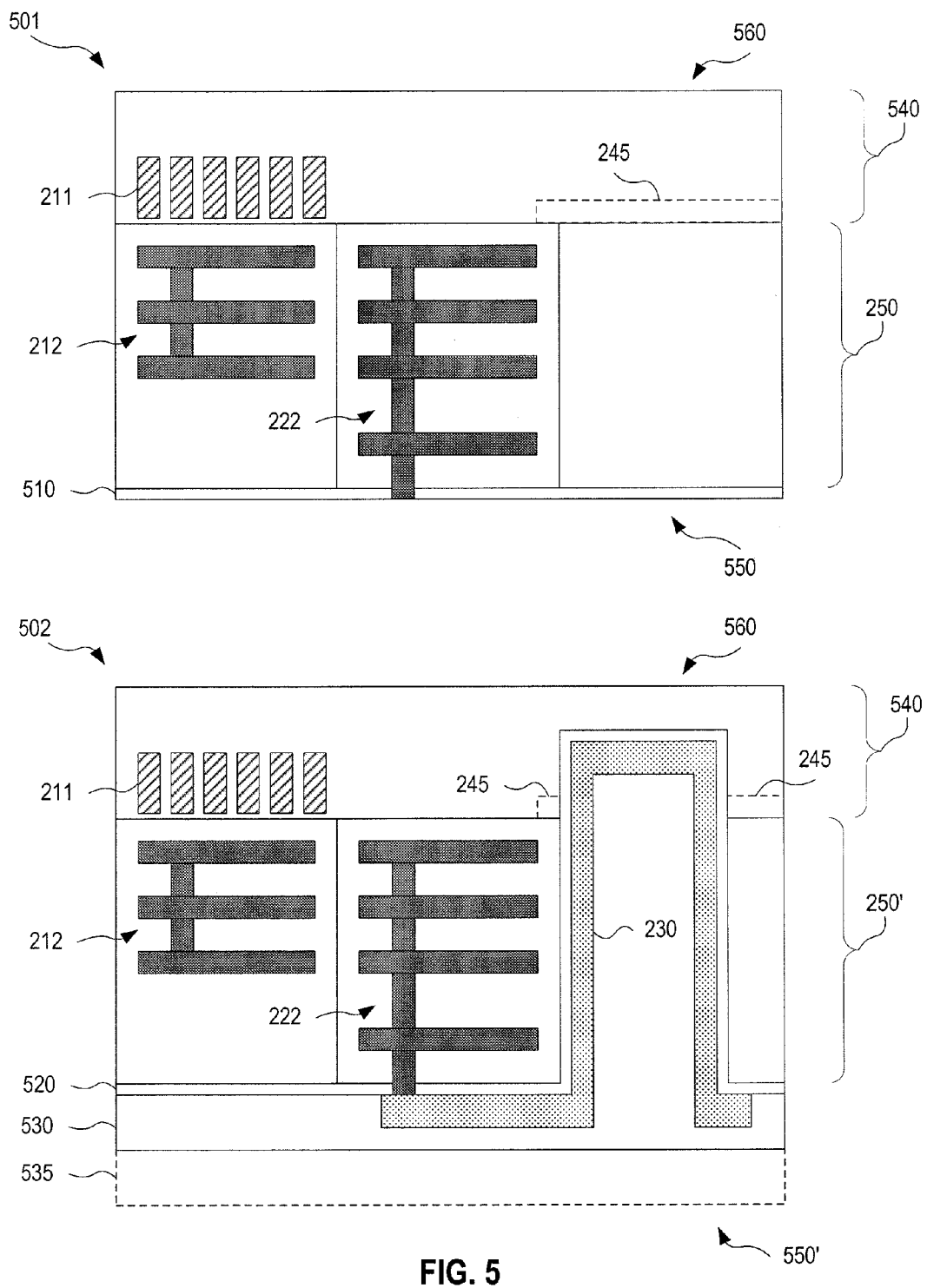
FIG. 5 illustrates certain steps of the method of FIG. 4, according to an embodiment.

FIG. 4 illustrates one exemplary method 400 for manufacturing a BSI color image sensor, such as BSI color image sensor 200 (FIGS. 2A and 2B), or a wafer of BSI color image sensors, such as image sensor wafer 300 (FIG. 3). FIG. 5 schematically shows examples of certain steps of method 400. FIGS. 4 and 5 are best view together.

In a step 410, method 400 receives an image sensor wafer. For example, method 400 receives an image sensor wafer with a plurality of image sensors 501 (FIG. 5). In the present disclosure, the term "image sensor" may refer to a finished image sensor or the state of the same during manufacturing thereof. FIG. 5 shows image sensor 501 in a cross-sectional side-view, where the cross-section is taken along line 2B-2B in FIG. 2A. Image sensor 501 includes circuitry layer 250 (FIG. 2B), a photodiode layer 540, and an electrically insulating liner 510. Image sensor 501 has frontside 550 and backside 560. Photodiode layer 540 is an embodiment of photodiode layer 240 (FIG. 2B), and includes a plurality of photodiodes 211 (FIG. 2B). Optionally, photodiode layer 540 includes electrically insulating material 245 (FIG. 2B). Electrically insulating liner 510 has an opening that exposes a portion of metal interconnect layer 222 (FIG. 2B). Electrically insulating liner 510 is, for example, silicon oxide, silicon nitride, a combination thereof, or a material that includes silicon oxide and/or silicon nitride. Electrically insulating liner 510 may have thickness in the range between 50 nanometers and 500 nanometers.

In a step 420, the frontside of the image sensor wafer is modified to produce electrical connections to the pixel arrays, wherein the electrical connections extend depth-wise into the interior of the image sensor wafer. For example, an image sensor wafer including a plurality of image sensors 501 having frontsides 550 is modified to produce, from each image sensor 501, an image sensor 502 having a frontside 550' and electrical connections 230 (FIGS. 2 and 5). In an embodiment, step 420 includes a step 422, wherein the electrical connections are produced to extend to a depth at least beyond the location of the photodiodes of the pixel arrays. For example, as illustrated by image sensor 502, electrical connection 230 extends depth-wise into the interior of image sensor 502 to a depth that is beyond the location of photodiode 211. In an embodiment, step 420 includes a step 424, wherein the electrical connections are electrically insulated. For example, frontsides 550 of image sensors 501 are modified to include electrically insulating liners 520, as shown for image sensor 502. Electrically insulating liner 520 insulates one or more electrical connections 230 from circuitry layer 250 and photodiode layer 540. Electrically insulating layer 520 includes a portion of electrically insulating layer 510. Electrically insulating liner 520 is, for example, silicon oxide, silicon nitride, a combination thereof, or a material that includes silicon oxide and/or silicon nitride. Electrically insulating liner 520 may have thickness in the range between 50 nanometers and 500 nanometers. In an embodiment, step 420 includes a step 426, wherein an electrically insulating layer is formed on the frontside of the image sensor wafer. The electrically insulating layer has a flat front-facing surface, which is bonded to a carrier wafer. For example, as illustrated by image sensor 502, an electrically insulating layer 530 is deposited on the frontside of the image sensor wafer to cover the frontside including electrical connections 230 and exposed portions of electrically insulating liners 520 of all image sensors 502 on the image sensor wafer. Subsequently, the image sensor wafer is bonded to a carrier wafer 535, as shown for image sensor 502 which is bonded to a portion of carrier wafer 535. Electrically insulating layer 530 includes, for example, silicon oxide. Electrically insulating layer 530 and carrier wafer 535 are embodiments of electrically insulating layer 260 (FIG. 2B) and carrier wafer 270 (FIG. 2B).

In a step 430, the backside of the image sensor wafer is modified to expose the electrical connections formed in step 420, thereby gaining access to the electrical connections from the backside. Step 430 includes a step 432, wherein a color filter is applied to the image sensor wafer backside. For example, the backside of the image sensor wafer is modified to expose electrical connections 230 through backsides 560 of image sensors 502, and apply a color filter to backsides 560. This results in the production of an embodiment of image sensor wafer 300.

Optionally, method 400 includes a step 440, wherein BSI image sensors are singulated from the image sensor wafer. For example, image sensor wafer 300 (FIG. 3), is cut along streets 330 (FIG. 3) to cingulate BSI color image sensors 200 (FIGS. 2 and 3).

Figure 6:
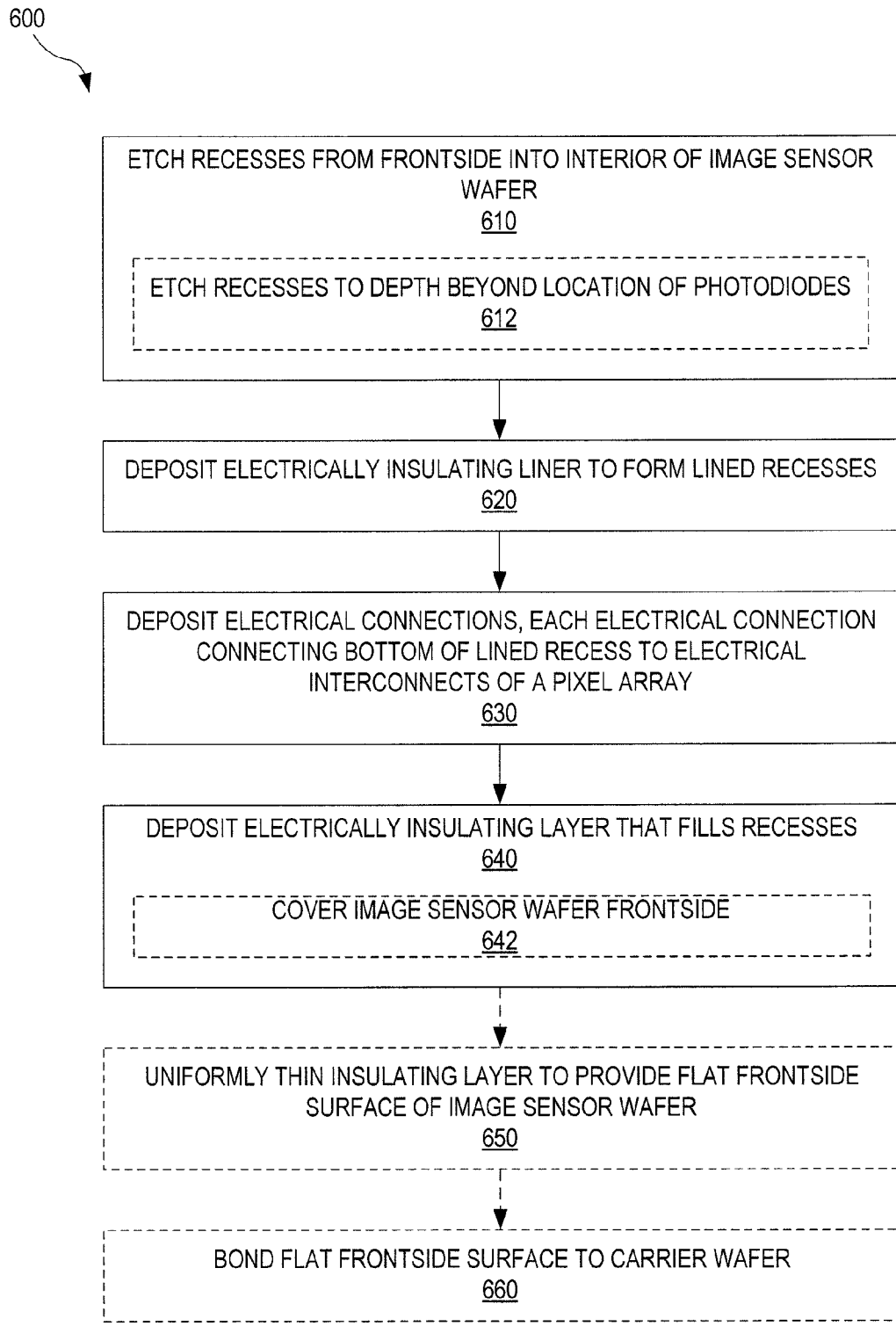
FIG. 6 illustrates a method for modifying the frontside of an image sensor wafer, to perform a portion of the method of FIG. 4, according to an embodiment.
Figure 7:
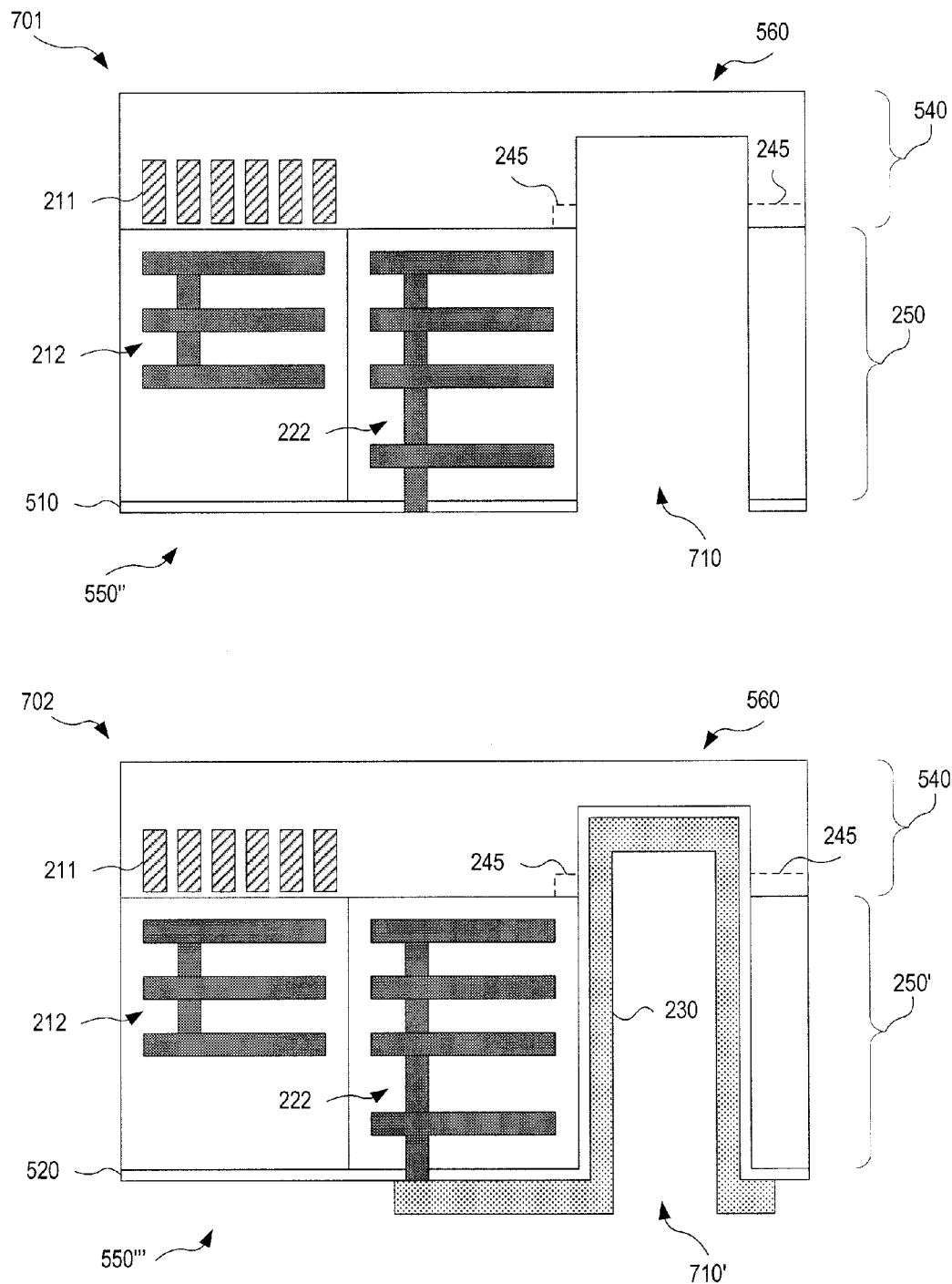
FIG. 7 illustrates certain steps of the method of FIG. 4, according to an embodiment.

FIG. 6 illustrates one exemplary method 600 for modifying the frontside of an image sensor wafer to produce electrical connections that may be made accessible from the backside of the image sensor wafer. Method 600 is an embodiment of step 420 of method 400 (FIG. 4). FIG. 7 schematically shows, together with FIG. 5, examples of certain steps of method 600. FIGS. 5, 6, and 7 are best view together. In a step 610, recesses are etched from the image sensor wafer frontside into the interior of the image sensor wafer. In an embodiment, step 610 includes a step 612, wherein the recesses are etched to a depth that is beyond the location of photodiodes of the pixel arrays of the image sensor wafer. For example, recesses are etched into frontsides 550 of image sensors 501 (FIG. 5) to produce image sensors 701 (FIG. 7). Image sensor 701 has a frontside 550", which includes at least one recess 710. Recess 710 extends through circuitry layer 250 (FIGS. 2 and 5) into photodiode layer 540 (FIG. 5), beyond the location of photodiodes 211 (FIGS. 2 and 5). In an embodiment, recess 710 extends between 2 micron and 4 micron into photodiode layer 540. In an embodiment, the bottom of recess 710, i.e., the portion of recess 710 closest to backside 560 of image sensor 701, is planar.

In a step 620, an electrically insulating liner is deposited in the recesses to form lined recesses. In one embodiment, all surface portions of the recesses are lined. In another embodiment, only surface portions of the recesses, which are associated with electrical connections formed in subsequent step 630 are lined. For example, an electrically insulating liner is deposited inside each recess 710 to form, together with portions of electrically insulating liner 510 (FIG. 5), electrically insulating liner 520 (FIG. 5) of image sensor 702 (FIG. 7). Although image sensor 501 (FIG. 5) is illustrated as including electrically insulating liner 510, electrically insulating line 510 may be omitted from image sensor 510 and instead produced in step 620, without departing from the scope hereof.

In a step 630, electrical connections are deposited on the frontside of the image sensor wafer, such that each electrical connection connects a portion of the bottom of a lined recess, formed in step 620, to the electrical interconnects of a pixel array. For example, electrical connections 230 are deposited on electrically insulating liners 520 (FIG. 5), as shown for image sensor 702, such that each electrical connection 230 contacts metal interconnect layer 222 and the portion of recess 710 closest to backside 560. This results in image sensor 702 having a frontside surface 550''' and recess 710'. In one embodiment, a plurality of electrical connections are deposited in a single recess. For example, recess 710 is an elongated trench having a longer dimension in the plane of the image sensor wafer, and a plurality of electrical connections 230 are deposited in recess 710 at a respective plurality of positions along the longer dimension of recess 710. In another embodiment, electrical connections are deposited such that no recess contains more than one electrical connection. For example, each electrical connection 230 is deposited in a different recess 710.

In a step 640, an electrically insulating layer is deposited on the image sensor wafer frontside. The electrically insulating layer fills the recesses formed in step 610 through 630. The electrically insulating layer provides structural support for the electrical connections formed in step 630, when these electrical connections are exposed from the backside in subsequent step 430 of method 400 (FIG. 4). In an example, electrically insulating layer 530 (FIG. 5) is deposited on the frontside of an image sensor wafer including a plurality of image sensors 702 (FIG. 7) having frontsides 550'''. As illustrated for image sensor 502 (FIG. 5), electrically insulating layer 530 fills recess 710'. Optionally, step 640 includes a step 642, wherein the electrically insulating layer is deposited such that it covers the frontside of the image sensor wafer. This is illustrated by electrically insulating layer 530 (FIG. 5) that covers the entire frontside of image sensor 502 (FIG. 5).

In an optional step 650, relevant for embodiments of method 600 that include optional step 642, the electrically insulating layer is uniformly thinned to provide a flat frontside surface, such as that illustrated by electrically insulating layer 530 (FIG. 5). Chemical-mechanical polishing methods may be utilized to uniformly thin the electrically insulating layer. In a subsequent optional step 660, the flat frontside surface is bonded to a carrier wafer. For example an image sensor wafer including a plurality of image sensors 502 (FIG. 5), without carrier wafer 535 (FIG. 5), is bonded to carrier wafer 535.

Figure 8:
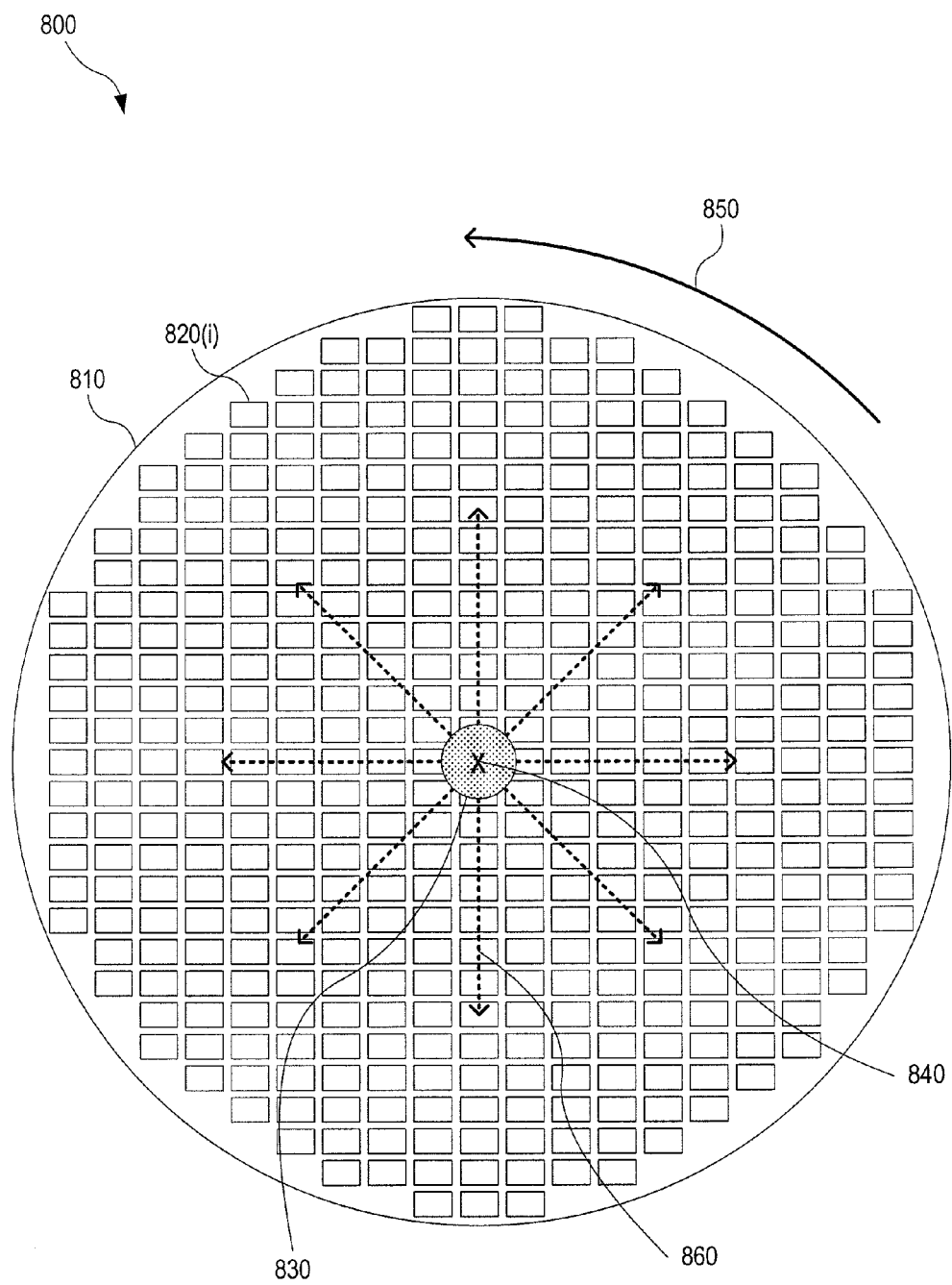
FIG. 8 is a diagram that illustrates a method for applying a color filter to an image sensor wafer, which may be used in the method of FIG. 4, according to an embodiment.

FIG. 8 is a diagram 800 illustrating application of a color filter to an image sensor wafer 810 that includes a plurality of image sensors 820. The general color filter formation process typically consists of (a) applying photoresist to image sensor wafer 810, (b) develop portions of the applied photoresist, by exposing these portions to light, to form respective color filter portions, and (c) removing undeveloped photoresist. In the case of forming a Bayer type color filter, steps (a), (b), and (c) are repeated for three different color types of photoresist, where each color type is developed for portions of image sensor wafer 810 corresponding to different pixels of image sensor 820. Diagram 800 thus illustrates one exemplary method for performing at least a portion of step 432 of method 400 (FIG. 4). For clarity of illustration, only one image sensor 820 is labeled in FIG. 8. FIG. 8 shows image sensor wafer 810 and image sensors 820 in top plan view. Photoresist is applied to a local area 830 of image sensor wafer 810. The support structure is spun about a rotation axis 840 in a direction 850. Rotation axis 840 is substantially perpendicular to the plane of image sensor wafer 810, and the backside surfaces of image sensors 820. In this example, local area 830 and rotation axis 840 are centered on image sensor wafer 810. As image sensor wafer 810 spins about rotation axis 840, the photoresist disperses from local area 840 in a radially outward direction indicated by arrows 860 (only one arrow labeled in FIG. 8). This results in coating of the backside surfaces of image sensors 820, as well as other exposed portions of image sensor wafer 810. If deep recesses are present on the surface of image sensor wafer 810, to which the photoresist is applied, these recesses may distort the radially outward from of photoresist indicated by arrows 860. For example, if the recesses are elongated trenches, photoresist may preferably travel along these trenches. Distortion of the radially outward flow may in turn lead to a non-uniform coating thickness, and thus degraded performance of the color filter. Accordingly, it is preferred to apply the color filter to a flat surface.

Figure 9:
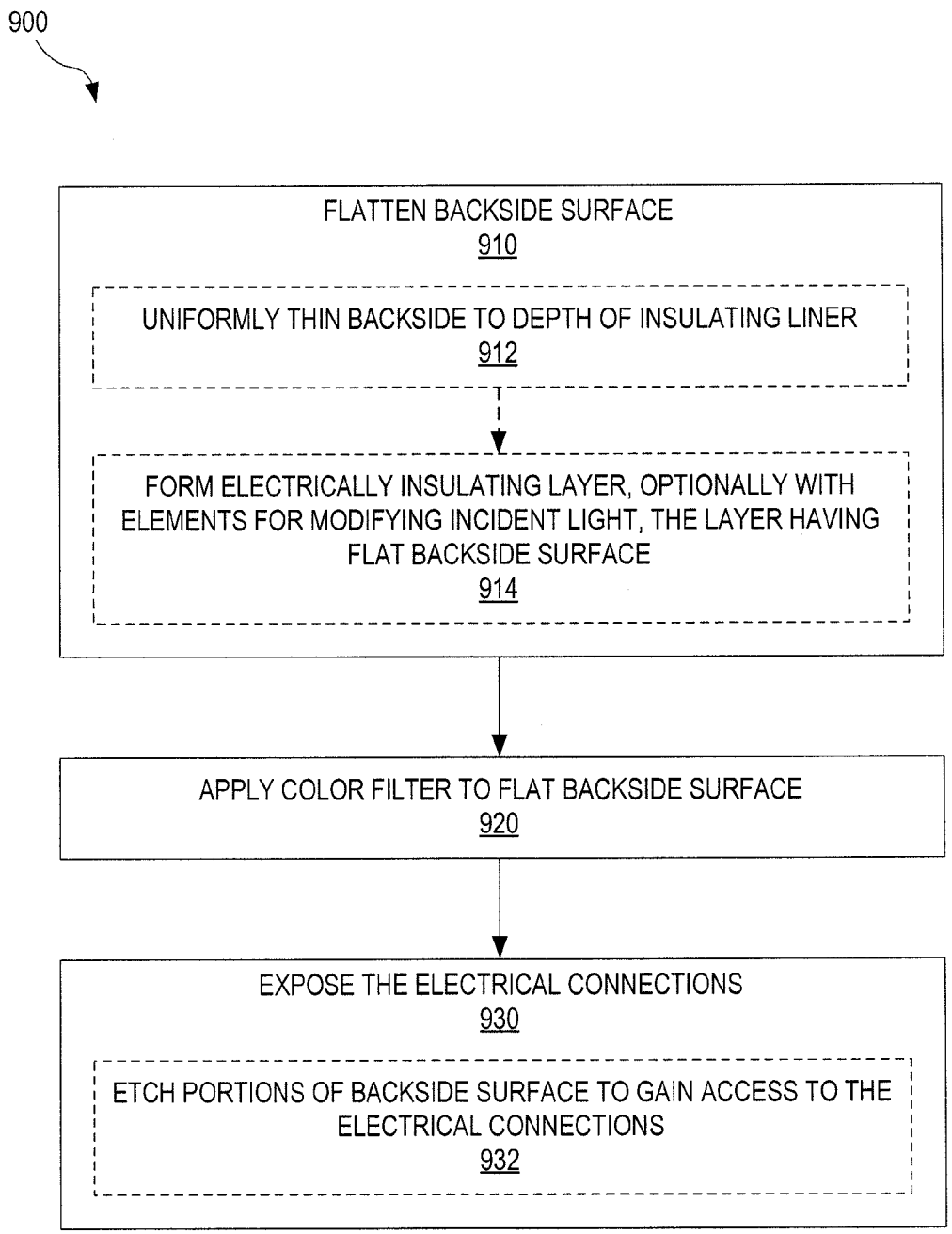
FIG. 9 illustrates a method for modifying the backside of an image sensor wafer, to perform a portion of the method of FIG. 4, wherein a color filter is applied to the backside of the image sensor wafer before exposing electrical connections, according to an embodiment.
Figure 10:
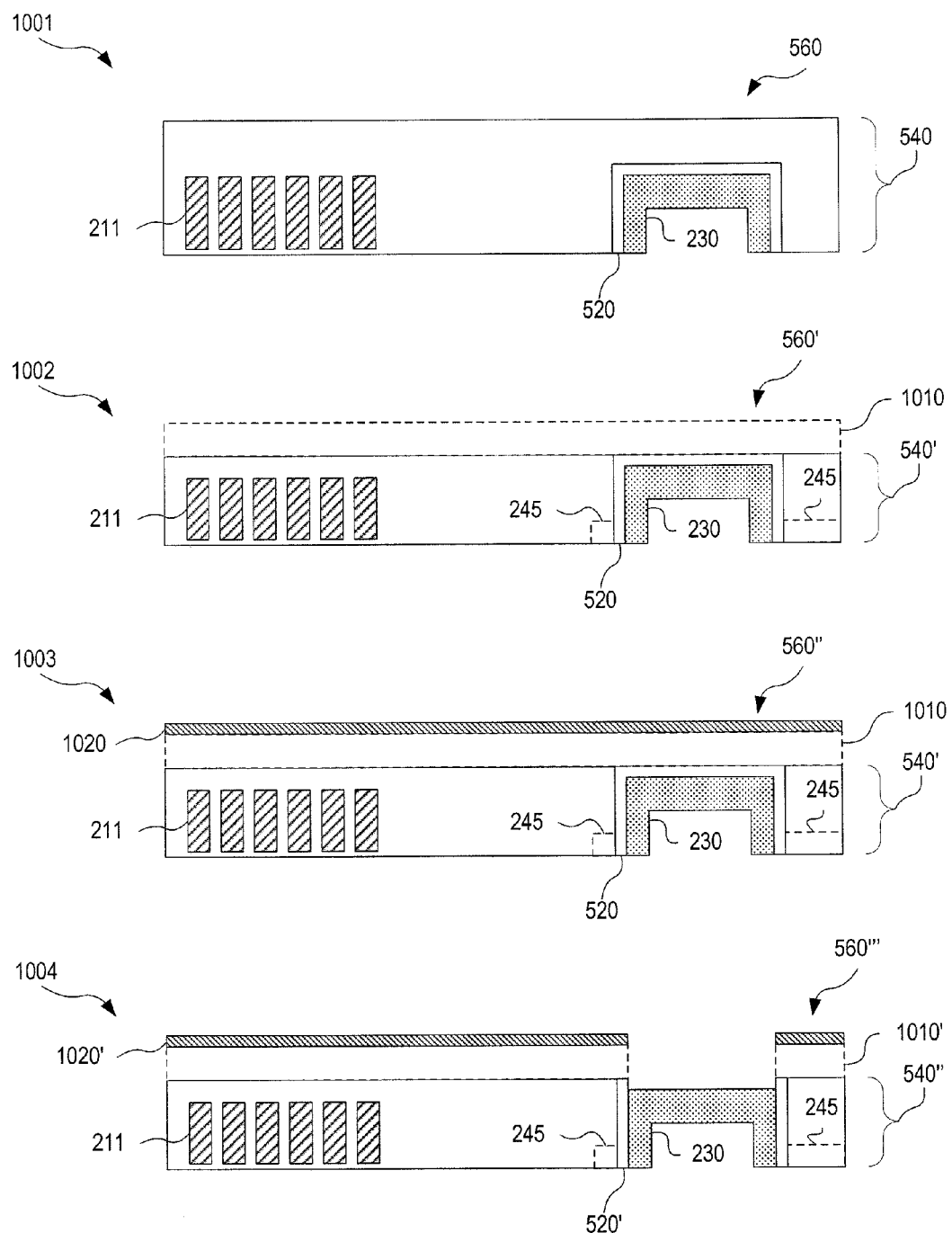
FIG. 10 illustrates steps of the method of FIG. 9, according to an embodiment.

FIG. 9 illustrates one exemplary method 900 for modifying the backside of an image sensor wafer, wherein a color filter is applied prior to exposing electrical connections formed during frontside processing of the image sensor wafer. Method 900 is an embodiment of step 430 of method 400 (FIG. 4). FIG. 10 schematically illustrates, by example, steps of method 900. FIGS. 9 and 10 are best view together.

In a step 910, at least a portion of the image sensor wafer is flattened to provide a flat backside surface of the image sensor wafer. In one embodiment, the full backside surface of the wafer is made flat. In another embodiment, portions of the backside surface near the perimeter of the wafer in areas not occupied by image sensors may deviate from flatness. Image sensor 1001 of FIG. 10 is an embodiment of image sensor 502 of FIG. 5, and is identical to image sensor 502 at least from backside 560 (FIG. 5) to the interface between photodiode layer 540 and circuitry layer 250. Image sensor 1001 is shown in the same view as image sensor 502. However, for illustrative clarity, only the portion of image sensor 1001 from backside 560 to the interface between photodiode layer 540 and circuitry layer 250 is shown in FIG. 10. Image sensor 1001 may be identical to image sensor 502 (FIG. 5). In an example of step 910, the backside of an image sensor wafer including a plurality of image sensors 1001 is processed to provide a flat backside surface. This results in the production of an image sensor wafer including a plurality of image sensors 1002 having a flat backside surfaces 560'. Accordingly, each image sensor 1001 of the image sensor wafer is modified to form image sensor 1002.

In an embodiment, step 910 includes a step 912, wherein the backside of the image sensor wafer is uniformly thinned to provide a flat surface. Chemical-mechanical polishing methods may be utilized to uniformly thin the backside of the image sensor wafer. For example, an image sensor wafer including a plurality of image sensors 1001 is uniformly thinned until electrically insulating liner 520 (FIG. 5) is exposed. As a result, for each image sensor 1001, photodiode layer 540 is uniformly thinned to produce an image sensor 1002. Image sensor 1002 has flat backside surface 560' and a photodiode layer 540' that is thinner than photodiode layer 540 of image sensor 1001.

Optionally, step 910 further includes a step 914, wherein an optical layer is formed on the backside of the image sensor wafer. The optical layer may include elements for modifying incident light, for example to prevent or reduce cross talk between neighboring pixels of individual pixel arrays. In embodiments of step 910 that include step 914, the optical layer provides the flat backside surface. Step 914 is illustrated by the inclusion of an optical layer 1010 in image sensor

1002. Manufacturing of optical layer 1010 includes (a) depositing elements for modifying light incident on flat backside surface 560' such that optical layer 1010 provides flat backside surface 1010. For example, an anti-reflective coating may be deposited on the image sensor wafer backside, followed by deposition of a metal grid encapsulated in an electrically insulating material. The metal grid serves to reduce or prevent illumination incident on one pixel from reaching a photodiode of a neighboring pixel. The electrically insulating material may be or include silicon oxide. Finally, the electrically insulating material is uniformly thinned, for example using chemical-mechanical polishing methods, to provide flat backside surface 560'.

In a step 920, a color filter is applied to the flat backside surface formed in step 910. In an embodiment, step 920 includes three, or more, sequential steps of applying a different color filter coating to the flat backside surface of the image sensor wafer, using the method illustrated in FIG. 8. For example, green, red, and blue color filter coatings are sequentially applied to form a Bayer-type color filter. In an example, step 920 results in the formation of a color filter 1020 on flat backside surface 560' of each image sensor 1002 of an image sensor wafer. Thus, at least some of image sensors 1002, of an image sensor wafer, are modified to produce respective image sensors 1003. Each image sensor 1003 has a backside surface 560" that includes color filter 1020.

In a step 930, the electrical connections formed in step 420 of method 400 (FIG. 4) are exposed. For example, backside 560" of each image sensor 1003 is modified to gain access to electrical connections 230, as illustrated for image sensor 1004. Image sensor 1004 has backside surface 560'''. In an embodiment, step 930 includes a step 932, wherein portions of the backside surface of the image sensor wafer are etched to expose the electrical connections. For example, for each image sensor 1003, portions of backside surface 560" are etched to the depth of electrical connection 230 to produce image sensor 1004. This includes etching through optional optical layer 1010 and electrically insulating liner 520 at locations coinciding with electrical connections 230, thus forming electrically insulating layer 520' and optical layer 1010'. Although FIG. 10 shows image sensor 1004 as having all of the bottom of electrical connection 231 exposed, image sensor 1004 may have only a portion of the bottom of electrical connection 231 exposed, without departing from the scope hereof. The etching process in step 932 does not involve etching a deep layer of silicon. Therefore, the masking of the color filters, such as color filters 1020, is less demanding than the corresponding masking required in conventional methods where electrical access is achieved by etching several micron into silicon.

Figure 11:
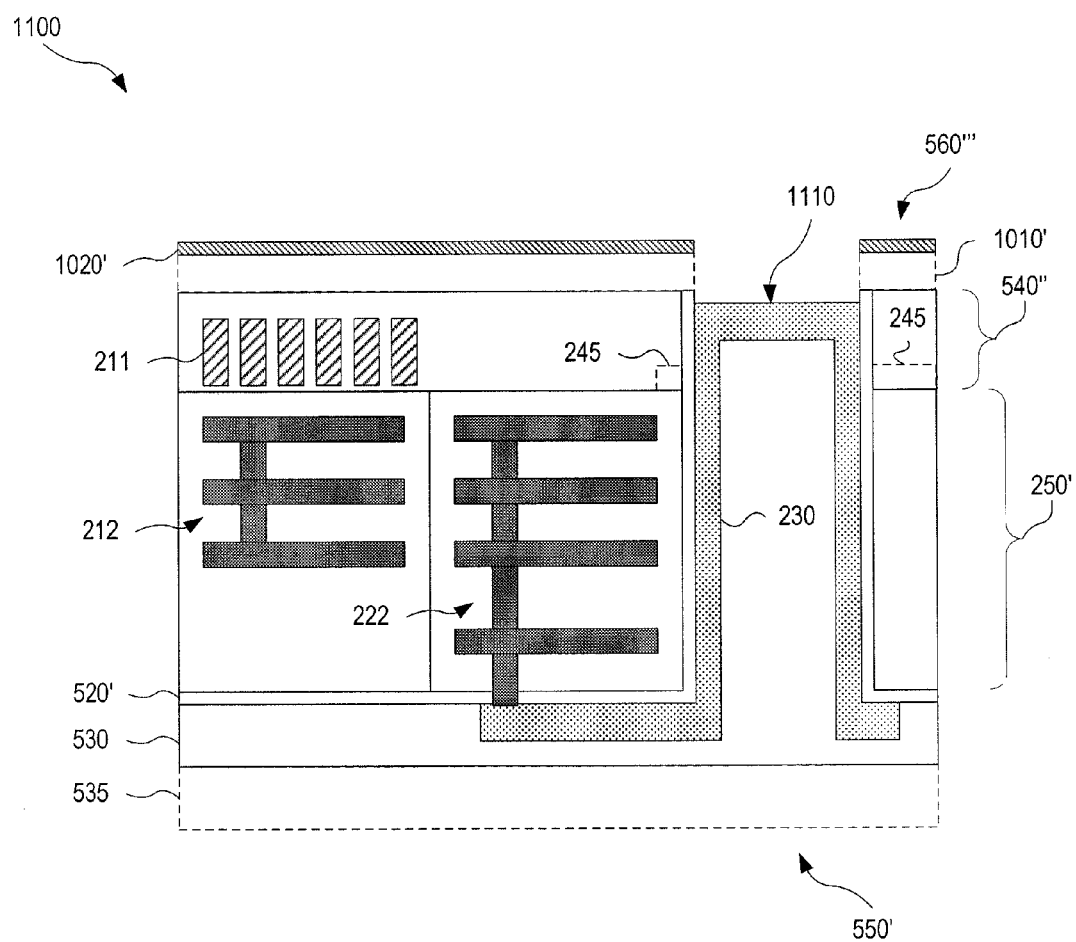
FIG. 11 illustrates a backside illuminated image sensor pixel manufactured using the methods of FIGS. 4, 6, and 9, according to an embodiment.

FIG. 11 illustrates one exemplary BSI color image sensor 1100 formed by method 400 (FIG. 4), including step 440 and with steps 420 and 430 implemented according to methods 600 (FIG. 6) and 900 (FIG. 9), respectively. BSI color image sensor 1100 is an embodiment of BSI color image sensor 200 (FIG. 2). BSI color image sensor 1100 is shown in cross-sectional side view along line 2B-2B of FIG. 2A. BSI color image sensor 1100 is composed of (a) the portion of image sensor 1004 (FIG. 10) that is between backside surface 560''' and the interface of photodiode layer 540' and circuitry layer 250, as discussed in connection with image sensor 1001 of FIG. 10, and (b) the portion of image sensor 502 (FIG. 5) that is between frontside 550' and the interface of photodiode layer 540 and circuitry layer 250. The exposed portion of electrical connection 230 forms an electrical connection pad 1110, such that BSI color image sensor 1100 may include a plurality of electrical connection pads 1110.

Figure 12:
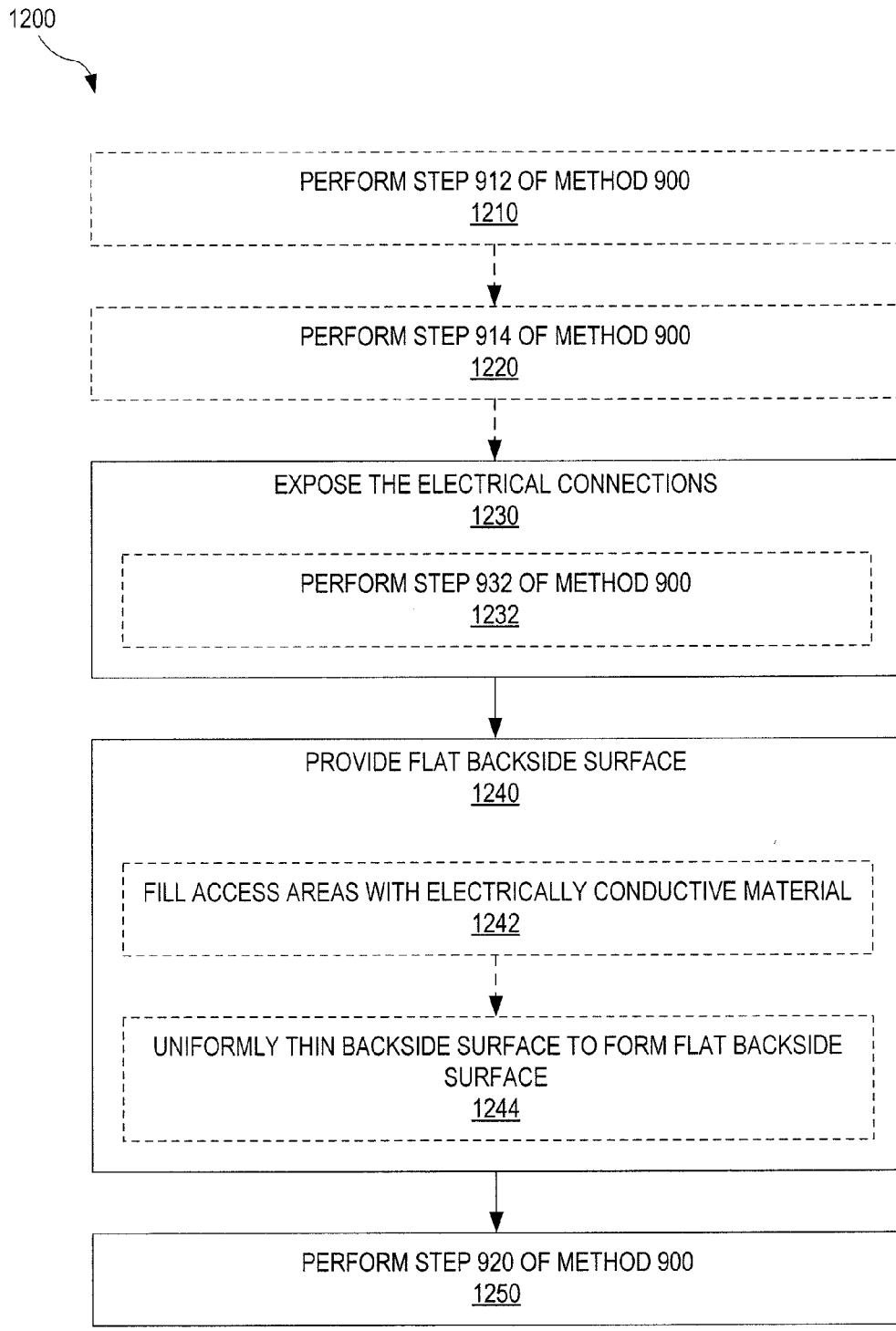
FIG. 12 illustrates a method for modifying the backside of an image sensor wafer, to perform a portion of the method of FIG. 4, wherein a color filter is applied to the backside of the image sensor wafer after exposing electrical connections, according to an embodiment.
Figure 13:
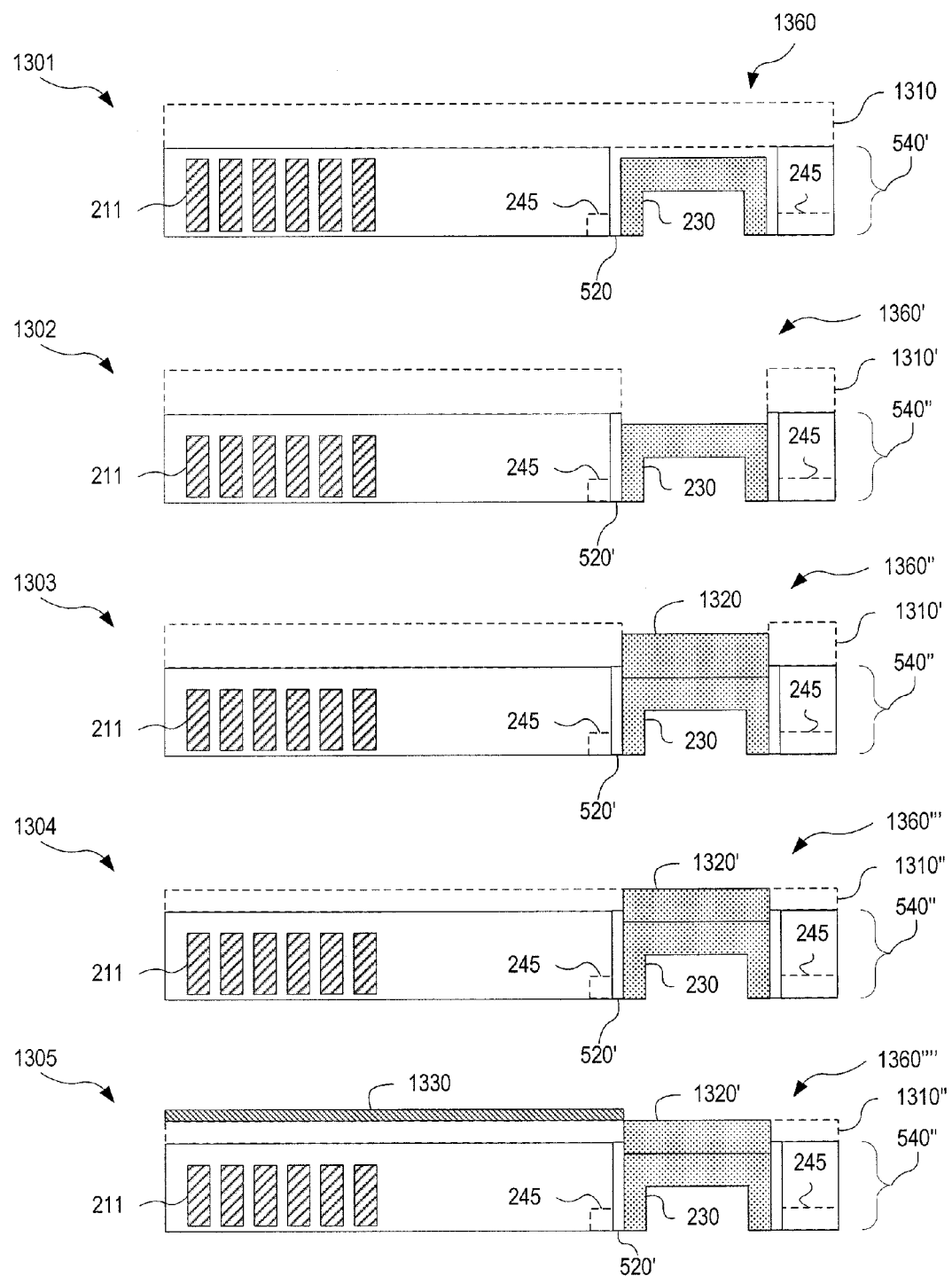
FIG. 13 illustrates steps of the method of FIG. 12, according to an embodiment.

FIG. 12 illustrates one exemplary method 1200 for modifying the backside of an image sensor wafer, wherein a color filter is applied after exposing electrical connections formed during frontside processing of the image sensor wafer. Method 1200 is an embodiment of step 430 of method 400 (FIG. 4). FIG. 13 schematically illustrates, by example, steps of method 1200. FIGS. 12 and 13 are best view together.

In an optional step 1210, method 1200 performs step 912 of method 900 (FIG. 9). For example, an image sensor wafer including a plurality of image sensors 1001 (FIG. 10) is uniformly thinned until electrically insulating liners 520 (FIGS. 5 and 10) are exposed. This is illustrated by image sensor 1301 (FIG. 13) having backside 1360. FIG. 13 illustrates image sensor 1301 in a view equivalent to the view of image sensor 1001 of FIG. 10. In a subsequent optional step 1220, method 1200 performs step 914 of method 900 (FIG. 9). Step 1220 is illustrated by the inclusion of an optional optical layer 1310 in image sensor 1301. Optical layer 1310 is similar to optical layer 1010 (FIG. 10) but may, for example, have thickness different from optical layer 1010.

In a step 1230, the backside of the image sensor wafer is modified to expose the electrical connections formed in step 420 of method 400 (FIG. 4). For example, an image sensor wafer including a plurality of image sensors 1301 is modified to produce, from each of at least some of image sensors 1301, an image sensor 1302. Image sensor 1302 has backside 1360', optical layer 1310', and electrically insulating liner 520', which provide access to electrical connections 230. In an embodiment, step 1230 includes a step 1232, wherein method 1200 performs step 932 of method 900, as discussed in connection with FIGS. 9 and 10.

In a step 1240, a flat backside surface of the image sensor is provided. In one embodiment, the full backside surface of the image sensor wafer is made flat. In another embodiment, portions of the backside surface near the perimeter of the wafer in areas, not occupied by image sensors, may deviate from flatness. In an example, the backside of an image sensor wafer, including a plurality of image sensors 1302, is modified to have a flat backside surface. In an embodiment, step 1240 includes steps 1242 and 1244. In step 1242, backside access areas to the electrical connections are filled with an electrically conductive material. For example, for each image sensor 1302 of an image sensor wafer, areas above electrical connections 230 are filled with an electrically conductive material 1320, to form an image sensor 1303. Image sensor 1303 has backside 1360", which includes electrically conductive material 1320 located on the exposed portion of electrical connection 230. Electrically conductive material 1320 may be an aluminum-copper alloy. While FIG. 13 illustrates electrically conductive material 1320 as only partially filling the access area above electrical connection 1320, electrically conductive material 1320 may completely fill the access area and even extend beyond the backside-facing surface of optical layer 1310. In step 1244, the backside of the image sensor wafer is uniformly thinned, using for example chemical-mechanical polishing methods, to form a flat backside surface of the image sensor wafer. For example, an image sensor wafer, including a plurality of image sensors 1303, is uniformly thinned to form a flat backside surface of the image sensor wafer. As a result, backside 1360" of each image sensor 1303 is uniformly thinned to produce an image sensor 1304. Image sensor 1304 has a flat backside surface 1360''', which includes optical layer 1310''' and electrically conductive material 1320'. Optical layer 1310" is a thinned version of optical layer 1310'. Electrically conductive material 1320' is either the same as electrically conductive material 1320' or a thinned version thereof.

In a step 1250, method 1200 performs step 920 of method 900. For example, method 1200 applies a color filter 1330 to backside surface 1360' of each image sensor 1304 to form image sensors 1305. Each image sensor 1305 has backside 1360"", which includes color filter 1330.

Figure 14:
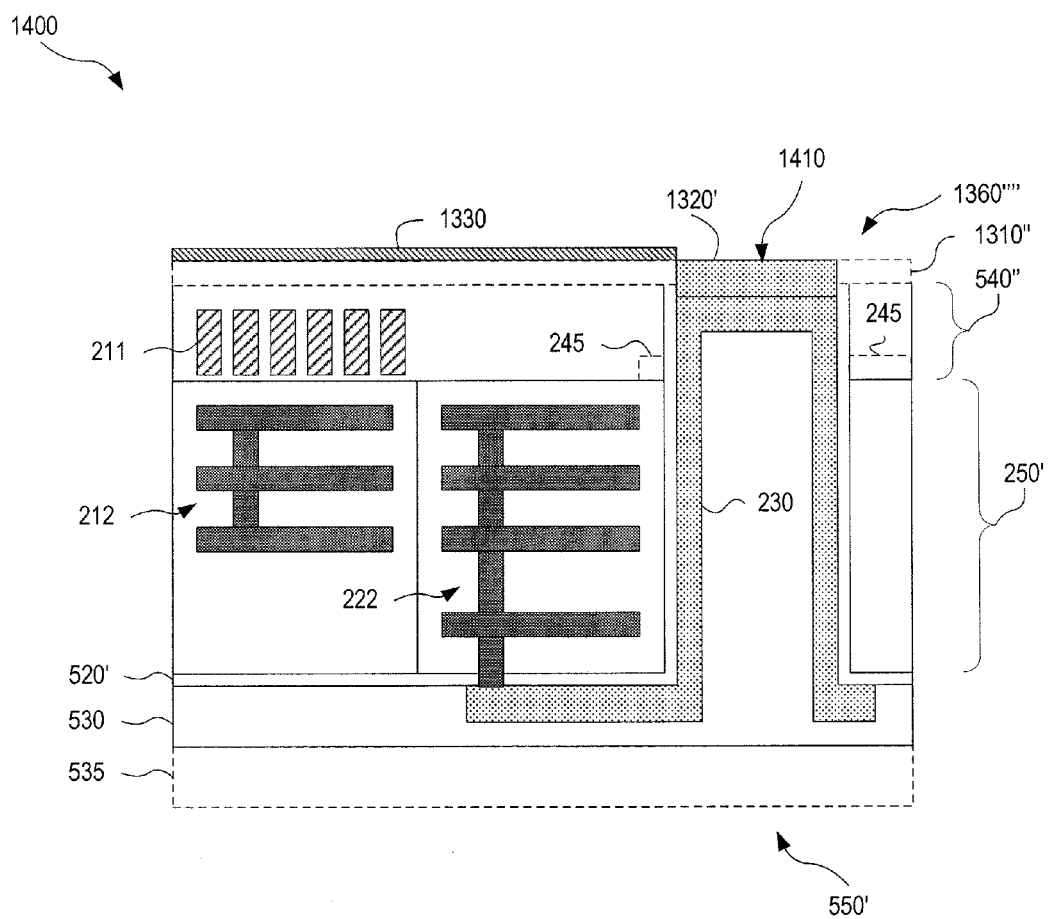
FIG. 14 illustrates a backside illuminated image sensor pixel manufactured using the methods of FIGS. 4, 6, and 12, according to an embodiment.

FIG. 14 illustrates one exemplary BSI color image sensor 1400 formed by method 400 (FIG. 4), including step 440 and with steps 420 and 430 implemented according to methods 600 (FIG. 6) and 1200 (FIG. 12), respectively. BSI color image sensor 1400 is an embodiment of BSI color image sensor 200 (FIG. 2). BSI color image sensor 1400 is shown in cross-sectional side view along line 2B-2B of FIG. 2A. BSI color image sensor 1400 is composed of (a) the portion of image sensor 1305 (FIG. 13) that is between backside surface 1360"" and the interface of photodiode layer 540' and circuitry layer 250, and (b) the portion of image sensor 502 (FIG. 5) that is between frontside 550' and the interface of photodiode layer 540 and circuitry layer 250. The exposed portion of electrically conductive material 1320' forms an electrical connection pad 1410, such that BSI color image sensor 1400 may include a plurality of electrical connection pads 1410.

Combinations of Features

Features described above as well as those claimed below may be combined in various ways without departing from the scope hereof. For example, it will be appreciated that aspects of one backside illuminated color image sensor, or method for manufacturing the same, described herein may incorporate or swap features of another backside illuminated color image sensor, or method for manufacturing the same, described herein. The following examples illustrate possible, non-limiting combinations of embodiments described above. It should be clear that many other changes and modifications may be made to the methods and device herein without departing from the spirit and scope of this invention:

(A) A method for manufacturing a backside illuminated color image sensor may include (i) modifying frontside of an image sensor wafer, including pixel arrays, to produce electrical connections to the pixel arrays, wherein the electrical connections extend depth-wise into the image sensor wafer from the frontside, and (ii) modifying backside of the image sensor wafer to expose the electrical connections.

(B) In the method denoted as (A), the step of modifying backside may include (i) flattening the backside of the image sensor wafer to provide a flat backside surface, (ii) applying a color filter to the flat backside surface, and (iii) exposing the electrical connections.

(C) In the method denoted as (B), the step of exposing may be performed before the step of flattening.

(D) In the method denoted as (B), the step of exposing may be performed after the step of applying.

(E) In the methods denoted as (A) through (D), the step of modifying frontside may include forming recesses and the electrical connections, wherein each of the electrical connections connect bottom of recesses to circuitry of one of the pixel arrays.

(F) In the methods denoted as (A) through (E), the step of modifying frontside may include etching recesses.

(G) In the method denoted as (F), the step of modifying frontside may further include depositing electrical connections, each electrical connection connecting a portion of bottom of one of the recesses to electrical interconnects of one of the pixel arrays.

(H) In the method denoted as (G), the step of modifying frontside may further include depositing electrically insulating material, the insulating material filling the recesses.

(I) In the method denoted as (F), the step of modifying frontside may further include forming lined recesses by depositing electrically insulating liner inside the recesses.

(J) In the method denoted as (I), the step of modifying frontside may further include depositing electrical connections, each electrical connection connecting a portion of bottom of one of the lined recesses to electrical interconnects of one of the pixel arrays.

(K) In the method denoted as (J), the step of modifying frontside may further include depositing electrically insulating material, the insulating material filling the lined recesses.

(L) In the methods denoted as (F) through (K), the step of etching recesses may include etching recesses at least to depth beyond location of photodiodes of the pixel arrays.

(M) The methods denoted as (I) and (K), may further include uniformly thinning the electrically insulating material, and bonding the electrically insulating material to a carrier wafer.

(N) In the methods denoted as (A) through (M), the step of exposing the plurality of electrical connections may include etching portions of the backside to gain access to the plurality of electrical connections.

(O) In the method denoted as (N), the step of etching may include etching portions of a dielectric layer to gain access to the plurality of electrical connections.

(P) In the method denoted as (D), the step of modifying frontside may include disposing the electrical connections on an electrically insulating liner.

(Q) In the method denoted as (P), the step of flattening may include (i) uniformly thinning the backside to depth of the electrically insulating liner, and (ii) producing electrically insulating layer, on the backside, wherein the electrically insulating layer provides the flat backside surface.

(R) In the method denoted as (Q), the step of flattening may further include producing elements for modifying incident light, wherein the elements may be at least partially encapsulated by the electrically insulating layer.

(S) In the methods denoted as (Q) and (R), the step of flattening may include depositing an oxide layer with elements for modifying incident light and uniformly thinning the oxide layer to provide the flat backside surface.

(T) In the method denoted as (D), the step of modifying frontside may include disposing the electrical connections on an electrically insulating liner.

(U) In the method denoted as (T), the step of modifying backside may further include, before the step of exposing: (i) uniformly thinning the backside to depth of the electrically insulating liner, and (ii) producing electrically insulating layer on the backside.

(V) In the method denoted as (U), the step of exposing may include etching portions of the electrically insulating layer to gain access to the plurality of electrical connections.

(W) In the method denoted as (V), the step of flattening may include filling the portions with electrically conductive material and uniformly thinning the backside to provide the flat backside surface.

(X) A backside illuminated color image sensor may include (i) a plurality of electrical connection pads located on backside of image sensor, (ii) a respective plurality of electrical connections connecting the plurality of electrical connection pads to front-facing portion of pixel array circuitry of the image sensor, and (iii) a color filter disposed on backside of the image sensor.

(Y) In the backside illuminated color image sensor denoted as (X), each of the plurality of electrical connections, for all portions thereof away from the plurality of electrical connection pads and not contacting the pixel array circuitry, may be surrounded by electrically insulating material.

(Z) The backside illuminated color image sensors denoted as (X) and (Y) may include a pixel array layer that has a photodiode sublayer with a photodiode array, and a circuitry sublayer of electrical interconnects for the photodiode array; wherein each of the plurality of electrical connections may be located in a front-facing recess of the pixel array sublayer and on a front-facing portion of the circuitry sublayer.

(AA) In the backside illuminated color image sensor denoted as (Z), the front-facing recess may span full depth of the pixel array layer.

(AB) The backside illuminated color image sensors denoted as (Z) and (AA) may include a frontside layer covering front-facing surface of the pixel array layer and spanning separation between back-facing surface of the backside and the pixel array layer (AC) In the backside illuminated color image sensor denoted as (AB), the frontside layer may have uniform thickness in all areas not coinciding with one of the plurality of electrical connection pads.

(AD) In the backside illuminated color image sensors denoted as (X) through (AD), the surface of the backside of the image sensor may be flat.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and device, which, as a matter of language, might be said to fall therebetween.

What is claimed is:

1. A method for manufacturing a backside illuminated color image sensor, comprising:
   modifying frontside of an image sensor wafer, including pixel arrays, to produce electrical connections to the pixel arrays, the electrical connections extending depthwise into the image sensor wafer from the frontside;
   exposing the electrical connections from backside of the image sensor wafer;
   after the step of exposing, flattening the backside of the image sensor wafer to provide a flat backside surface; and
   after the step of flattening, applying a color filter to the flat backside surface.

2. The method of claim 1, the step of modifying frontside comprising forming recesses and the electrical connections, each of the electrical connections connecting bottom of recesses to circuitry of one of the pixel arrays.

3. The method of claim 1, the step of exposing the electrical connections comprising etching portions of the backside to gain access to the electrical connections.

4. The method of claim 3, the step of etching comprising etching portions of a dielectric layer to gain access to the electrical connections.

5. The method of claim 1,
   in the step of modifying frontside, the electrical connections being disposed on an electrically insulating liner; and
   the step of flattening the backside comprising (a) uniformly thinning the backside to depth of the electrically insulating liner, and (b) producing electrically insulating layer, on the backside, the electrically insulating layer providing the flat backside surface.

6. The method of claim 5, the step of flattening the backside further comprising producing elements for modifying incident light, the elements being at least partially encapsulated by the electrically insulating layer.

7. The method of claim 5, the step of flattening the backside comprising:
   depositing oxide layer with elements for modifying incident light; and
   uniformly thinning the oxide layer to provide the flat backside surface.

8. A method for manufacturing a backside illuminated color image sensor, comprising:
   modifying frontside of an image sensor wafer, including pixel arrays, to produce electrical connections to the pixel arrays, the electrical connections extending depthwise into the image sensor wafer from the frontside;
   flattening backside of the image sensor wafer to provide a flat backside surface;
   after the step of flattening, applying a color filter to the flat backside surface; and
   after the step of applying, exposing the electrical connections.

9. The method of claim 8, further comprising:
   in the step of modifying frontside, disposing the electrical connections on an electrically insulating liner;
   before the step of exposing the electrical connections, (a) uniformly thinning the backside to depth of the electrically insulating liner, and (b) producing electrically insulating layer on the backside;
   in the step of exposing, etching portions of the electrically insulating layer to gain access to the plurality of electrical connections; and
   in the step of flattening, filling the portions with electrically conductive material and uniformly thinning the backside to provide the flat backside surface.

10. The method of claim 8, the step of modifying frontside comprising forming recesses, each of the electrical connections connecting bottom of recesses to circuitry of one of the pixel arrays.

11. The method of claim 8, the step of exposing the electrical connections comprising etching portions of the backside to gain access to the electrical connections.

12. The method of claim 11, the step of etching comprising etching portions of a dielectric layer to gain access to the electrical connections.

13. A method for manufacturing a backside illuminated color image sensor, comprising:
   modifying frontside of an image sensor wafer, including pixel arrays, to produce electrical connections to the pixel arrays, the electrical connections extending depthwise into the image sensor wafer from the frontside, the step of modifying the frontside including:
   (a) etching recesses,
   (b) forming lined recesses by depositing electrically insulating liner inside the recesses,
   (c) depositing the electrical connections, each of the electrical connection connecting a portion of bottom of one of the lined recesses to electrical interconnects of one of the pixel arrays, and
   (d) depositing electrically insulating material, the insulating material filling the lined recesses; and
   modifying backside of the image sensor wafer to expose the electrical connections.

14. The method of claim 13, the step of etching recesses comprising etching recesses at least to depth beyond location of photodiodes of the pixel arrays.

15. The method of claim 14, further comprising:
uniformly thinning the electrically insulating material; and
bonding the electrically insulating material to a carrier wafer.

16. The method of claim 13, the step of modifying backside of the image sensor wafer to expose the electrical connections comprising etching portions of the backside to gain access to the electrical connections.

17. The method of claim 16, the step of etching portions of the backside comprising etching portions of a dielectric layer to gain access to the electrical connections.

\* \* \* \* \*

UNITED STATES PATENT AND TRADEMARK OFFICE
CERTIFICATE OF CORRECTION

PATENT NO.      : 9,184,206 B1
APPLICATION NO. : 14/270309
DATED           : November 10, 2015
INVENTOR(S)     : Wei Zheng et al.

Page 1 of 1

It is certified that error appears in the above-identified patent and that said Letters Patent is hereby corrected as shown below:

Specification
Column 4, line 61, "have extent different" should read -- have an extent different --;
Column 5, line 22, "4 and 5 are best view together" should read -- 4 and 5 are best viewed together --;
Column 6, line 32, "cingulate" should read -- singulate --;
Column 6, line 40, "6, and 7 are best view together" should read -- 6, and 7 are best viewed together --;
Column 8, line 12 and 13, "radially outward from of photoresist" should read -- radially outward flow of photoresist --;
Column 8, line 25, "9 and 10 are best view together." should read -- 9 and 10 are best viewed together. --;
Column 11, line 3, "1360'" should read -- 1360 --;
Column 11, line 33, "and device herein" should read -- and devices herein --.

Signed and Sealed this
Fifth Day of July, 2016

Michelle K. Lee
*Director of the United States Patent and Trademark Office*